United States Patent [19]

Lacombat et al.

[11] 4,375,315

[45] Mar. 1, 1983

[54] ARC LAMP ILLUMINATOR

[75] Inventors: Michel Lacombat; Georges Dubroeucq, both of Paris, France

[73] Assignee: Thomson-CSF, Paris, France

[21] Appl. No.: 142,471

[22] Filed: Apr. 21, 1980

[30] Foreign Application Priority Data

Apr. 23, 1979 [FR] France .................. 79 10210

[51] Int. Cl.³ ............................... G02B 5/17
[52] U.S. Cl. .................... 350/96.25; 362/32
[58] Field of Search .......... 350/96.24, 96.25; 362/32

[56] References Cited

U.S. PATENT DOCUMENTS

| 3,586,562 | 6/1971 | Jones | 350/96.24 |
| 3,825,336 | 7/1974 | Reynolds | 350/96.24 |
| 4,106,078 | 8/1978 | Inoue | 362/32 |
| 4,206,494 | 6/1980 | Lovering | 362/32 |
| 4,281,366 | 7/1981 | Wurster et al. | 362/32 |

*Primary Examiner*—John D. Lee
*Attorney, Agent, or Firm*—Oblon, Fisher, Spivak, McClelland & Maier

[57] ABSTRACT

Arc lamp illuminator which can be used in an optical device for the transfer of patterns, incorporating a mixed fibre bundle which intercepts in an image plane of the source part of the emitted radiation. The exit cross-section of the bundle is adapted to the degree of coherence of the desired illumination measured on the pupil of the optical transfer device. At the entrance, the fibres of the bundle are assembled into two separate bundles, whose ends are aligned with the maximum intensity zone formed in the image plane of the source.

6 Claims, 6 Drawing Figures

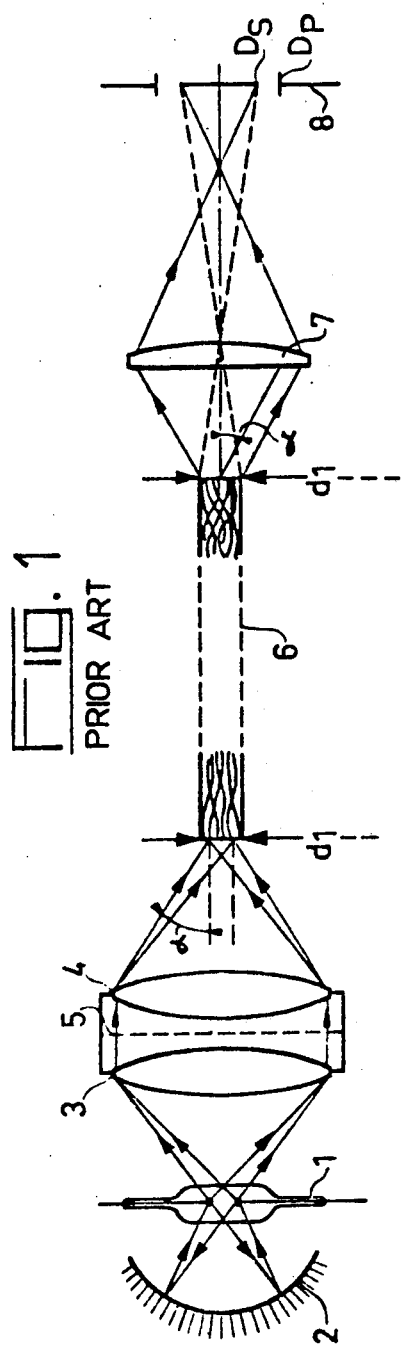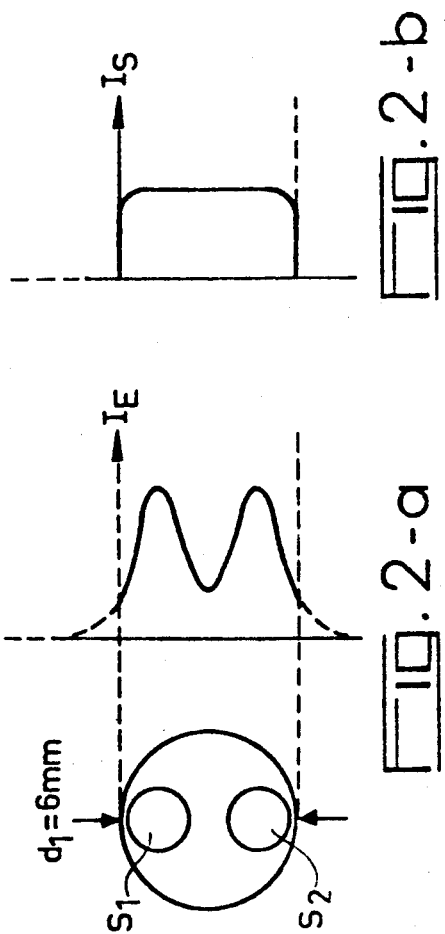

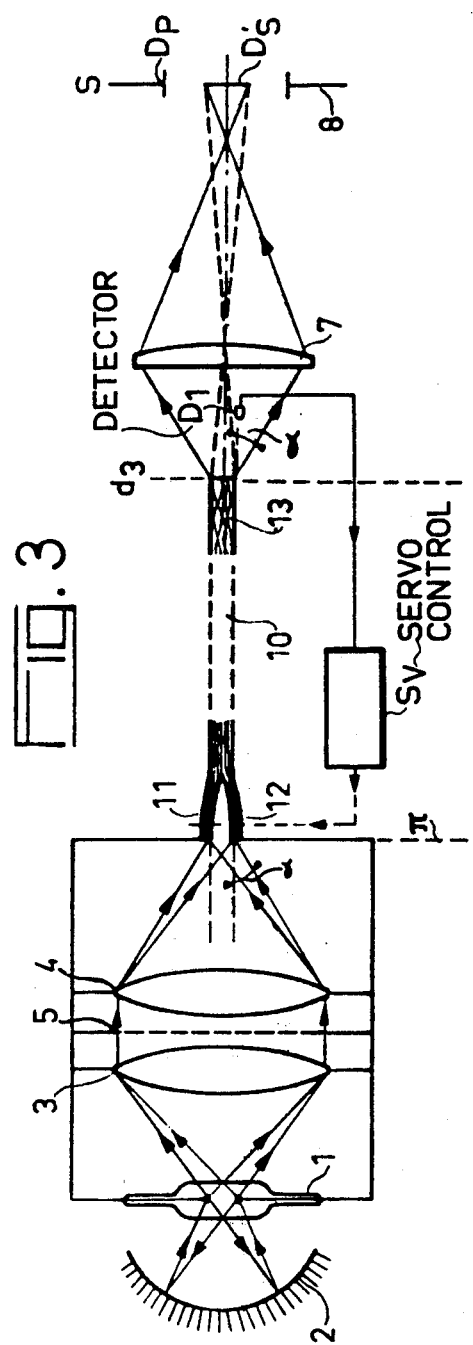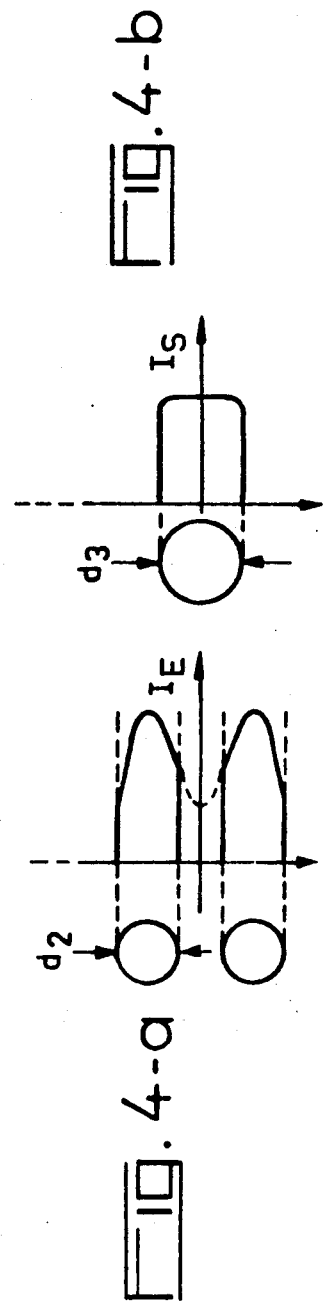

ARC LAMP ILLUMINATOR

BACKGROUND OF THE INVENTION

1. Field of the Invention

The invention relates to the field of the optical transfer of patterns by projecting and more particularly, relates to an illuminator for such optical transfer.

2. Description of the Prior Art

In the manufacture of integrated circuits, windows make it possible to locate the implantation or treatment on the substrate (silicon, gallium arsenide) for each stage in the manufacture of the integrated circuit level on the substrate. These windows are produced by masking a resin layer deposited on the substrate from a mask. According to an early method, the mask was placed in contact or in the vicinity of the substrate for exposure. The tendency has been to replace this method by an optical projection transfer method, which can be performed with a selected magnification and the pattern can be repeated by the photorepetition method.

For the optical transfer of patterns, it is possible to use illuminators which can, for example, be laser sources or arc discharge lamps, more particularly mercury discharge lamps. These are associated with suitable filters for obtaining an illumination which is compatible with the often vary narrow spectral band of the projection lenses (B≈100 mm). The light from the source illuminates the object (i.e. the mask) via condensers, the object being positioned in the vicinity of the the latter. In general terms, it has been found that a compromise between the effective resolution likely to be obtained and the field could be obtained by using a partly spatially coherent light. The ratio $\sigma$ between the diameter of the line projected onto the entrance pupil of the optical projection system and the diameter of the pupil constitutes a measure of the coherence of the illumination. When $\sigma=0$, the illumination is coherent, when $\sigma=\infty$, the illumination is incoherent and when $\sigma=1$ the illumination is quasi-incoherent. In the case of illuminators associated with conventional projection lenses of numerical apperture 0.3 and diameter 15 mm for example, this compromise is at present $\sigma=0.7$. In the case of such illuminators, account is taken of the energy efficiency, $\sigma=0.7$ being a value for which this efficiency is considered suitable. In order to obtain such a coefficient $\sigma$, a suitably diaphragmed extended source is used.

Calculation has shown that a significant improvement in a certain number of parameters on which the performance ratings of the optical transfer device depend is obtained with a coefficient $\sigma=0.3$, i.e. a more spatially coherent illumination than that used in a conventional illuminator in which $\sigma$ is 0.7. Thus, the effective resolution increases with the coherence. The width of the minimum line likely to be obtained decreases when the coherence of the illumination increases. The definition also increases when the coherence increases. Moreover, defects due to thickness variations in the resin layer deposited on an already shaped surface decrease when coherence increases. Taking into account of all these parameters, an increase in the coherence of the illumination is desirable to obtain finer and more accurately controlled patterns.

However, the energy efficiency must not become too low and the defects linked with an excessive coherence of the illumination must not appear. These disadvantages can lead on the one hand to an excessive limitation of the diameter of the effective source and on the other in a greater sensitivity of the transfer device to local defects (and to dust) present on the reticle and on the projection lens. These defects linked with a high degree of coherence with regard to surface defects can be limited by taking care of the projection lens.

The energy efficiency can be maintained in an illuminator chosen with $\sigma=0.3$ by the optimum utilization of the intensity distribution supplied by the source in conjunction with the entrance pupil of the lens in order that the limitation to the dimensions of the source have minimum effect on the energy efficiency.

SUMMARY OF THE INVENTION

An object of the present invention is the utilization of an illuminator incorporating an arc lamp designed so that the energy efficiency is at a maximum, taking account of a given degree of spatial coherence of the illumination.

The present invention relates to an arc lamp illuminator forming a radiant energy source including a system of condenser lens and filters forming in an image plane of the source a real image thereof on the basis of the radiation from the arc lamps, such image having two zones of maximum intensity, wherein the illuminator also incorporates an optical fibre bundle and an intermediate lens placed at the fibre bundle exit, whose exit face is such that its image by the intermediate lens gives rise to an illumination having a given degree of spatial coherence for a given utilization device, the fibres of the bundle being assembled in the entrance face placed in the image plane of the source in two separate bundles, whose ends intercept the radiation in the image plane of said source, the ends of these two separate bundles being aligned with the two maximum intensity zones in the image plane of the source.

BRIEF DESCRIPTION OF THE DRAWINGS

Various other objects, feature and attendant advantages of the present invention will be more fully appreciated as the same becomes better understood from the following detailed description when considered in connection with the accompanying drawings in which like reference characters designate like or corresponding parts throughout the several views, and wherein:

FIG. 1 shows a prior art mercury discharge lamp illuminator in which the degree of coherence of the illumination is $\sigma=0.7$;

FIGS. 2a and 2b illustrate the illumination distribution, respectively, at the entrance and exit of the fibre bundle with respect to the illuminator of FIG. 1;

FIG. 3 shows an illuminator according to the invention in which the degree of coherence is $\sigma=0.3$; and FIGS. 4a and 4b illustrate the illumination distribution, respectively, at the entrance and exit of the beam with respect to the illuminator of FIG. 3.

DETAILED DESCRIPTION OF THE PREFERRED EMBODIMENTS

FIG. 1 shows an illuminator incorporating a mercury arc discharge lamp of the type currently used in which the degree of coherence $\sigma$ is equal to 0.7. It incorporates a mercury discharge lamp 1. Lamp 1 has two hot points between which the arc is formed. The light radiated from such a lamp seems to come largely from these two points which form in some way "source points". A mirror 2 returns to the optical device part of the radiation permitted towards the rear of the device.

The illuminator also has a condenser formed by two lenses 3 and 4 and a system of filters 5 making it possible to select from among the different lines of the mercury emission spectrum one or more lines of wavelengths usable for the optical transfer of patterns. This condenser—filter system makes it possible to form an image of the source in an image plane. The illumination distribution in this image plane is similar to that in the source plane. This distribution is shown in FIG. 2a. This radiation is then intercepted by a bundle 6 of mixed optical fibres in such a way that in the exit face of the bundle the illumination distribution is quasi-uniform, as shown in FIG. 2b. At the entrance, the fibre bundle intercepts the radiation at an incidence which does not exceed $\alpha$, $\alpha$ being the aperture signal angle of the fibre and at the exit restores the radiation with the same incidences (not exceeding $\alpha$). This aperture is chosen as a function of the numerical aperture and of the diameter of the lens used, as well as of the diameter of the exit face of the bundle, so that the light flux is maintained.

The exit face of the fibre bundle 6 is imaged through lens 7 onto entrance pupil 8 of the projection lens (not shown). For example, in the case of a 350 W lamp, the two hot points of the source are 3.8 mm apart, such points being the centers of light zones $S_1$ and $S_2$ with a diameter of approximately 2 mm. Bearing in mind its characteristics, a fibre bundle of $d_1 = 6$ mm is able to intercept most of the radiation emitted. The diameter of the effective source formed by the exit face of the beam is therefore $d_1 = 6$ mm. The exit lens 7 of the illuminator is such that it forms on the entrance pupil an image of the exit face such that its diameter $D_s$ is in the ratio $\sigma = 0.7$ with the diameter $D_p$ of the entrance pupil. The corresponding aperture $\alpha$ with the lens having a digital aperture of 0.3 and a diameter of 15 mm is 30°.

FIG. 3 shows the illuminator according to the invention. In this illuminator, the components which are the same as those in the illuminator of FIG. 1 are given the same reference numerals. The system formed by the mercury discharge lamp 1, mirror 2, condenser system 3, 4 associated with filters 5 is unchanged and in an image plane of the source forms an illumination distribution like that supplied by the source. In order to increase the spatial coherence of the source, the diameter of the effective source is reduced in a ratio such that in the source plane S for the optical projection device the diameter is equal to $d_3$. The source is imaged in the plane of the pupil in the form of a light source, whose diameter $D'_s$ is in the ratio $\sigma = 0.3$ with diameter $D_p$ of the entrance pupil. For this purpose, instead of reducing the size of the source by means of a diaphragm blocking a fraction of the radiation emitted by the exit face of the fibre bundle ensuring the mixing of the radiation (this solution corresponding to a reduction in the energy efficiency in the same ratio as the reduction in the surfaces of the useful sources) the illuminator according to the invention incorporates a fibre bundle, whose exit face has a diameter such that the image formed by the exit lens on the entrance pupil of the projection device gives a predetermined degree of coherence to the illumination. In the entrance face, this fibre bundle is divided into two beams, whose axes are aligned with the maximum illumination points in the image plane of the source by the condenser. Thus, bundle 10 has two ends 11 and 12 of diameters equal to $d_2$, whose longitudinal axes are aligned with the source points formed in the image plane $\pi$ and are substantially parallel to the longitudinal axis of bundle 10. Diameter $d_2$ is fixed in such a way that the diameter of the bundle at the exit corresponding to the joining of all the mixed bundle fibres $d_3 = \sqrt{2} d_2$ gives by imagery through the condenser lens 7 an effective source in the plane of the entrance pupil, whose diameter is in the ratio $\sigma$ with the diameter of the pupil. Such a construction makes it possible in all cases and in particular when $\sigma = 0.3$, which is considered to be optimum with regard to the other characteristics of the device, to have a maximum luminosity, because the effective source for the projection sustem is formed from the brightest zones of the source. Thus, for an energy efficiency given for $\sigma = 0.7$ with the illumination of FIG. 1, the simple solution consisting of diaphragmming to obtain $\sigma = 0.3$ leads to a loss of 80% of the light energy. However, the device according to the invention only leads to a 40% loss of light energy, which is largely compensated by the gains obtained by increasing the coherence.

In order that the ends of the two half beams in the image plane $\pi$ of the source are well positioned relative to the maximum illumination points in the plane, it is possible to definitively mechanically connect the discharge lamp 1, the condenser—filter system 3, 4, 5 and the ends of the two half-beams, as diagrammatically shown in FIG. 3.

However, it is also possible to control microdisplacements of the ends 11 and 12 of the half-beams in the plane by detecting by means of an opto-electronic detector (e.g. a photodiode) a small part of the radiation emerging from the beam by a position feedback loop SV, the displacement being such that this radiation is always at a maximum.

The invention is not limited to the embodiments described with reference to FIG. 3. In particular, the illuminator can have an arc discharge lamp using a gas other than mercury vapour. In order that the illuminator has the described construction, it is merely necessary that it is possible to determine in an image plane of the source the maximum illumination points on which will be aligned two separate ends of a mixed fibre bundle. Moreover, the specific description indicates that a degree of coherence of $\sigma = 0.3$ was chosen, because this value corresponds to a good effective resolution and does not lead to an excessive number of defects as occurs with an excessive degree of coherence. However, it is easy to select the characteristics of the fibre bundle as a function of those of the illuminator in order to obtain some other degree of coherence by maximizing the energy efficiency as described hereinbefore.

Finally, the description of one embodiment indicates that the two separate ends of the bundle in the image plane of the source have circular cross-sections and equal diameters. This arrangement is advantageous when the two light zones $S_1$ and $S_2$ formed by the arc lamps are circular and of the same diameter. However, in practice, these two zones are a function of the shape of the electrodes and can be oblong. In this case, the fibres could be arranged in ends placed in the image plane of the source in such a way that the cross-sections correspond in an optimum manner to the light spots formed. These spots can also have different surface areas. In the same way, the cross-section of the exit beams can be adapted to the device used.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An arc illuminator forming a radiant energy source comprising:
   an arc lamp;
   at least a first and second condenser lens and a filter positioned between said first and second lenses forming in an image plane of said source a real image thereof on the basis of the radiation from the arc lamp, said image having two zones of maximum intensity;
   an optical fiber bundle; and
   an intermediate lens placed at the fiber bundle exit, whose exit face is such that its image by said intermediate lens produces an illumination having a given degree of spatial coherence for a given utilization device, the fibers of the bundle being assembled in the entrance face placed in the image plane of the source in a first and second separate bundle having planar ends which intercept the radiation in the image plane of said source, the ends of said first and second separate bundles being aligned with the two maximum intensity zones in the image plane of the source and being of substantially equal diameter.

2. An illuminator according to claim 1, wherein the fibre bundle further comprises mixed fibres such that the radiation in the exit face of the bundle is distributed in a quasi-uniform manner.

3. An illuminator according to claim 1, wherein the arc lamp comprises a mercury discharge lamp.

4. An illuminator according to claim 3, wherein the positions of the ends of the first and second separate bundles are adjusted in a definitive manner, the two ends being mechanically connected to the arc lamp.

5. An illuminator according to claim 3, further comprising means for continuously controlling the position of said first and second bundles in the image plane of the arc lamp such that the emergent radiation is continuously maximized.

6. The arc illuminator of claim 1 wherein said planar ends of said first and second bundle are substantially perpendicular to the longitudinal axis of said bundle.

* * * * *